US006948149B2

(12) United States Patent
Goodwin

(10) Patent No.: US 6,948,149 B2
(45) Date of Patent: Sep. 20, 2005

(54) METHOD OF DETERMINING THE OVERLAY ACCURACY OF MULTIPLE PATTERNS FORMED ON A SEMICONDUCTOR WAFER

(75) Inventor: Francis Goodwin, Albany, NY (US)

(73) Assignee: Infineon Technologies, AG, (DE)

( * ) Notice: Subject to any disclaimer, the term of this patent is extended or adjusted under 35 U.S.C. 154(b) by 30 days.

(21) Appl. No.: 10/780,884

(22) Filed: Feb. 19, 2004

(65) Prior Publication Data

US 2005/0188342 A1 Aug. 25, 2005

(51) Int. Cl.[7] ............................................. G06F 17/50
(52) U.S. Cl. ............................ 716/21; 716/19; 716/20
(58) Field of Search ...................... 716/19–21; 430/5, 430/22; 356/401

(56) References Cited

U.S. PATENT DOCUMENTS 5,521,036 A * 5/1996 Iwamoto et al. .............. 430/22
5,877,861 A * 3/1999 Ausschnitt et al. ......... 356/401
6,664,121 B2 * 12/2003 Grodnensky et al. ......... 438/16
6,699,624 B2 * 3/2004 Niu et al. ....................... 430/5
6,734,971 B2 * 5/2004 Smith et al. ................ 356/401

* cited by examiner

Primary Examiner—Vuthe Siek
Assistant Examiner—Naum Levin
(74) Attorney, Agent, or Firm—Edell, Shapiro & Finnan LLC

(57) ABSTRACT

From a plurality of overlay targets formed with patterns on a test wafer, subsets are formed and for each overlay target contained in the subsets, the measurement results of overlay shifts are obtained. Mean shifts, residual data and ranges are calculated for each subset and compared with the 100% full field results. The subset that represents the full field results to highest agreement is selected and used to measure the overlay of a second or any further wafer. A most preferred embodiment relates to selecting each of the subsets in a form such that the overlay target positions are concentric about the wafer center. In a further advantageous aspect, each of the subsets is confined to concentric areas about the wafer center, e.g., an inner circle and/or one or more outer rings. A distribution of selected overlay targets placed in representative regions on the wafer is thus guaranteed.

18 Claims, 4 Drawing Sheets

METHOD OF DETERMINING THE OVERLAY ACCURACY OF MULTIPLE PATTERNS FORMED ON A SEMICONDUCTOR WAFER

FIELD OF THE INVENTION

The invention relates to a method of determining the overlay accuracy of patterns formed in successive layers on a semiconductor wafer, said patterns representing levels of an integrated circuit. The invention particularly relates to the field of metrology and to pattern alignment control of structures projected into different layers on a wafer.

BACKGROUND OF THE INVENTION

Integrated circuits are formed by repeatedly projecting a pattern in a lithographic step onto a semiconductor wafer and processing the wafer to transfer the pattern into a layer deposited on the wafer surface. Planarization and other intermediate processes may further be necessary to prepare a projection of a successive mask level.

In order to manufacture integrated circuits of increased device densities and smaller geometries large efforts have to be undertaken to guarantee sufficient alignment of patterns in different structured layers on the wafer. Quality control is performed by measuring the shifts of portions in a measurement mark that belong to a pattern of the current layer with respect to another portion of the mark that belongs to a previous layer. Typically, so-called box-in-box structures are used to quantify the amount of shift and the direction of a pattern in one layer with respect to another layer.

A measured amount of shift represents an overlay error. When performing overlay metrology in order to control the efficiency and the yield of a lithographic projection step or its post-processes, it often occurs that the measured shifts show a systematic trend with position on the wafer. For example, a signature of rotation is often discovered from modeling of the overlay error measurement results, when a polishing process has previously been applied to one of the layers under inspection.

Such systematic trends are expected in advance and a sample of measurement marks, referred to as overlay targets in what follows, is selected from a plurality of overlay targets distributed across the wafer that easily reflects such systematic trends. Sampling has become necessary because measuring the full plurality of overlay targets on a wafer would consume too much time and would reduce the throughput of wafers in a fabrication facility considerably.

However, with decreasing feature sizes of state of the art integrated circuits, arbitrary, non-systematic errors become more and more influential in the performance of the device. One example is lens aberration that leads to pattern shifts on a wafer, which depend on the particular combination of exposure apparatus employed for projecting patterns into respective layers. Another example is wafer warpage that depends on material characteristics and thermal as well as mechanical effects that have been acted upon a specific wafer.

Previous sampling methods selecting specific subsets of overlay targets across the wafer were not able to provide a good representation of the overall distribution of shifts on a wafer. Sometimes, small amounts of measured shifts determined from a small subset of overlay targets pretend a good alignment between two successively projected layers, while non-selected overlay targets positioned in other, more critical areas on a wafer would reveal large shifts if these were included in the measurement set. Accordingly, the quality of the quality control itself may disadvantageously be impacted. Since errors are therefore detected too late, e.g., in a tester step testing the integrated circuit, costs spent in damaged circuits have accumulated and the time to deliver circuits to the customer has unnecessarily increased.

It is accordingly an object of the invention to improve the quality of an overlay measurement step performed in semiconductor manufacturing. It is a particular object to increase the accuracy of the overlay measurement results, when these are represented by measurements using sample overlay targets. It is a further object of the invention to increase the yield and reduce the costs in semi-conductor manufacturing.

SUMMARY OF THE INVENTION

These and other problems are generally solved or circumvented, and technical advantages are generally achieved by the present invention that provides for a method of determining the overlay accuracy of multiple patterns formed within an arrangement of exposure fields on a semiconductor wafer, comprising the steps of:

providing a test wafer to an overlay measurement tool, said test wafer comprising said exposure fields with said patterns and a plurality of overlay targets formed with said patterns across said test wafer;

measuring first shifts of each of said overlay targets;

model systematic errors that represent correctable errors of an exposure tool and calculate non-correctable overlay errors from said measured first shifts of said plurality of overlay targets to form a first set of correctable and non-correctable errors;

selecting a number of overlay targets from said plurality of patterns and forming at least two different subsets thereof, wherein each subset comprises overlay targets residing in at least three of said exposure fields;

for each of said subsets performing the steps a) to c):
 a) obtaining said measured first shifts, which correspond to said selected overlay targets,
 b) calculate a second set of correctable and non-correctable errors from said measured first shifts of said selected overlay targets,
 c) comparing said second set of correctable and non-correctable errors with said first set of correctable and non-correctable errors;

selecting one of said subsets in dependence of the comparison results;

providing said semiconductor wafer and measuring second shifts of those overlay targets, whose positions on said semiconductor wafer coincide with positions of the overlay targets of said selected subset on said test wafer;

assessing the quality of said semiconductor wafer based on said measured second shifts.

Yet another solution to the object is provided by a method of determining the overlay accuracy of multiple patterns, which are formed within exposure fields being arranged in a matrix on a semiconductor wafer, comprising the steps of:

providing a test wafer to an overlay measurement tool, said test wafer comprising said patterns and plurality overlay targets formed with said patterns in each of said exposure fields across the test wafer;

measuring first shifts of each of said overlay targets;

determining a first set of correctable and non-correctable errors from said measured first shifts of said plurality of overlay targets;

selecting each three or more exposure fields comprising overlay targets having first positions from said matrix arrangement and forming at least two subsets thereof;

for each of said subsets performing the steps a) to c):
a) obtaining said measured first shifts of the overlay targets, which are contained within the selected exposure fields of the subset,
b) determining a second set of correctable and non-correctable errors from said measured first shifts,
c) comparing said second set of correctable and non-correctable errors with said first set of correctable and non-correctable errors;

selecting one of said subsets of exposure fields in dependence of the comparison results;

providing said semiconductor wafer and measuring second shifts of those overlay targets, whose positions on said semiconductor wafer coincide with positions of the overlay targets of said selected subset of exposure fields on said test wafer;

assessing the quality of said semiconductor wafer based on said measured second shifts.

The method steps are performed with one or more overlay measurement tools. The tool can be any type of microscope, e.g., one that is operating in the broadband regime, in the deep UV wavelength regime or a scanning electron microscope, etc. The test wafer has at least two layers—or the substrate and a layer—that each have been structured and post-processed and were aligned to each other. The overlay accuracy of both layers relative to each other is to be measured and determined by the means of the present invention.

Both layers on the substrate are structured with a pattern. Along with the pattern, a plurality of overlay targets extending over both layers are distributed across the wafer. Typically, the overlay targets are distributed periodically across the wafer, particularly in the case where the patterns are projected onto the wafer by means of exposure fields being arranged on the wafer surface in a matrix-like manner.

The overlay targets are repeatedly formed with the pattern in each exposure field according to the matrix-like arrangement. Each exposure field can have, e.g., a set of 4, 5 or more overlay targets placed in each corner of an exposure field and/or in the center.

Having provided this test wafer, the overlay characteristics of the first wafer are measured utilizing a full set of overlay targets, i.e., at least one overlay target from each exposure field on the wafer.

The results of this full characterization can be: a mean of the measure shifts (amount and direction of the shift or amount in x-direction and amount in y-direction), other systematic correctable overlay errors, systematic or random non-correctable errors, or the range of the measured shifts. Throughout the instant document such results are referred to as correctable or non-correctable errors—or error values, respectively.

According to one aspect of the invention, a number of subsets of overlay targets are selected from the plurality of overlay targets. Each subset may comprise three or more selected overlay targets. The actual number of overlay targets selected in each subset depends on what total number of targets can be accomplished during overlay tool measurements for a large number of wafers in order to increase the measurement efficiency.

A similar aspect relates to forming subsets of exposure fields, each exposure field comprising overlay targets. I.e., subsets of overlay targets are chosen by selecting subsets of exposure fields. The number of overlay targets contained in each of the subsets also depends on the efficiency needed for performing measurements on multiple wafers, in particular wafers arising from multiple lots of wafers.

In both aspects, selecting subsets of overlay targets directly or via selecting subsets of exposure fields, each of the subsets is tested to whether it represents a complete set of overlay targets, i.e., the plurality of overlay targets on the wafer, to sufficient agreement. For this purpose, the measured shifts of the specifically selected overlay targets that have been measured on the first test wafer are retrieved and the characteristic values of the correctable or non-correctable errors, e.g., the mean of the measure shifts, other systematic correctable overlay errors, systematic, or random non-correctable errors, or the range that are determined or calculated from this reduced set of measurement results.

For determining, which subset represents the overall result to best agreement, each of the derived quantities of a respective subset is compared against the corresponding overall test wafer measurement result.

The test wafer can simply be a first wafer of lot or a complete product run comprising multiple lots of wafers.

In dependence of the overlay measurement comparison results, one of the subsets of overlay targets is selected and applied to overlay measurements of a second or any further semiconductor wafer. Typically, the coordinates or positions of the exposure field or the directly determined overlay targets will be stored in a file made available to one or more overlay measurement tools used to apply the method. Each wafer corresponding to the product considered is then provided to a quality control, where the stored set of overlay targets is read out and then employed.

It is possible to attach process data to the stored subsets such that, e.g., a specific subset is employed in an overlay measurement that corresponds to a lithographic tool being previously used to project a pattern onto the wafer under inspection. Two dependent overlay characteristics may thus be considered.

A particularly advantageous aspect of the invention deals with setting up a further condition when selecting the number of subsets of overlay targets or exposure fields comprising overlay targets. The overlay targets in a subset have positions such that they are grouped concentrically around the center of the wafer. For the exposure fields in a matrix arrangement of identically manufactured wafers are positioned substantially similar on each wafer of a lot, the positions of overlay targets with respect to the wafer center are similar on the first, second, and any further wafer of the corresponding lot or product run. Accordingly, the condition is that the center of the positions of the selected overlay target subset coincides substantially with the wafer center on the first test wafer. This feature guarantees that the resulting subsets of overlay targets are distributed in different, but representative regions on the wafer. Locally occurring effects such as aberration are thus considered more appropriately.

According to a further aspect, the concentric arrangement of overlay targets in a subset is still improved by defining concentric areas, e.g., a ring or a circle in the center of the wafer, and selecting each one subset in one area thus defined. Using each one subset from a concentric area, the distribution of overlay targets used for an overlay measurement is even more homogenized and a uniform distribution of overlay targets across the wafer is achieved, which still fulfills the condition of representing the overall overlay behavior of patterns on the wafer.

BRIEF DESCRIPTION OF THE DRAWINGS

The above features of the present invention will be more clearly understood from consideration of the following descriptions in connection with accompanying drawings in which.

DETAILED DESCRIPTION

A presently preferred embodiment of the method according to the invention is discussed in detail below. It is appreciated, however, that the present invention provides many applicable inventive concept that can be embodied in a wide variety of specific contexts. The specific embodiments discussed are merely illustrative of specific ways to apply the method of the invention, and do not limit the scope of the invention.

Figure 1:
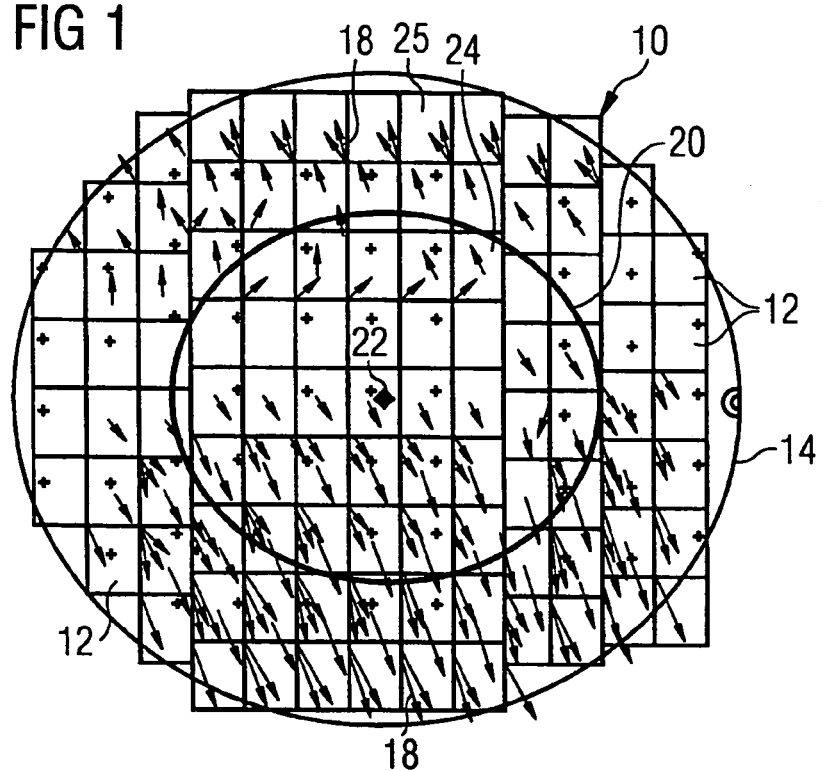
FIG. 1 is a plan view of a wafer with exposure fields, wherein overlay shifts are illustrated for a number of alignment marks.

FIG. 1 displays a plan view of a matrix-like arrangement 10 of exposure fields 12 projected onto a wafer 14. Each two layers—or a layer and the substrate—of the wafer 14 have each been structured with a pattern by means of lithographic projection followed by further post-processes, such as etching, planarization, deposition, etc. A pattern formed on a mask is thereby projected along with a number of overlay targets 16 into each of the exposure fields 12 on the wafer 14. Overlay shifts representing overlay errors between the patterns of both layers are measured thereafter using an overlay measurement tool. The resulting shifts are indicated as errors for a number of overlay targets 16 provided in each of the exposure fields 12. It is clearly visible from FIG. 1 that an extended area on wafer 14 in the lower portion comprises large shifts directed to the lower right corner of the figure, while an elongated stripe extending from the left to the right edge of the wafer 14 shows only small overlay errors. An upper portion of wafer 14 shows overlay shifts 18 directed to the upper left corner of the figure.

The measurement results shown in FIG. 1 represent a full field analysis performed for the plurality of overlay targets 16 projected with the patterns into the exposure fields 12. The data is collected and stored for further analysis.

Also shown in FIG. 1 is the definition of two concentric areas on the wafer separated by ring 20. Both areas are concentric about the wafer center 22, i.e., an inner circle 24 and an outer ring 25.

Figure 2:
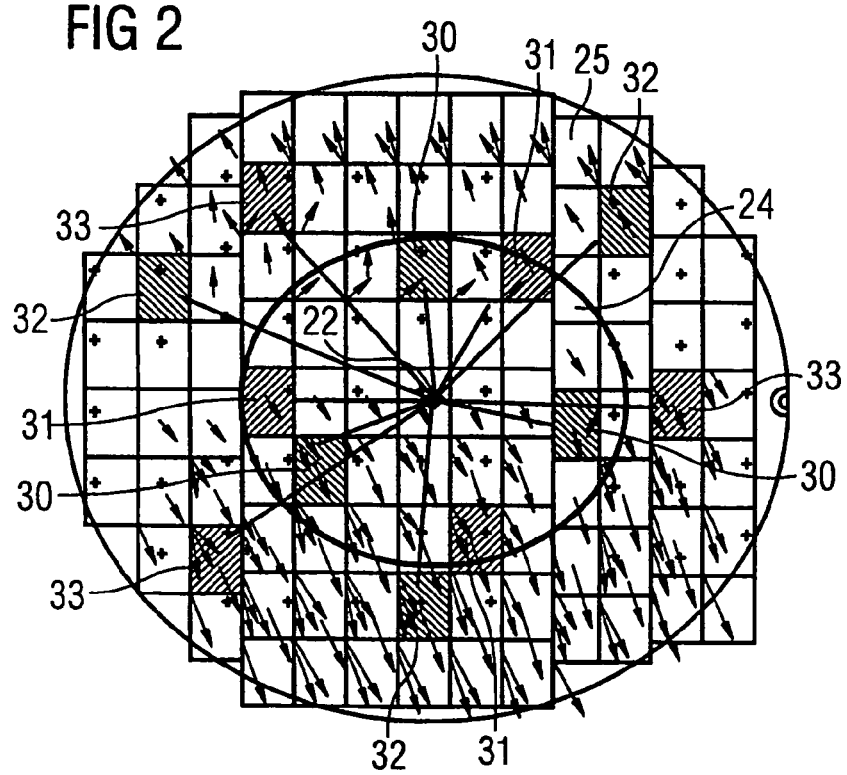
FIG. 2 is similar to FIG. 1, but with each two subsets for an inner circle and an outer ring corresponding to concentric areas defined for the exposure field map.

Next, as shown in FIG. 2, a number of, e.g., each ten subsets 30–33 comprising, e.g., each three exposure fields, are selected from the matrix-like arrangements. Those subsets located within the inner circle concentric area 24 can be related with each one located in the outer ring area 25. In this example, subset 30 is related with subset 32. A further condition that is to be fulfilled by the present selection of overlay targets within a subset is that each subset is also positioned concentrically around the wafer center 22.

In FIG. 2, only two related subsets are indicated. Measurement and analysis results of residuals as well as ranges in x- and y-direction for ten selected subsets are shown in the barred chart of FIG. 3. Along with the measurement and calculation results of the individual subsets are indicated the results for a test production job (PRODJOB) compared with a job where all overlay targets have been employed (100% JOB), all modeled using a linear regression analysis. Also included for comparison are those overlay errors where all of the targets were measured but modeled using a pure linear analysis.

Figure 3:
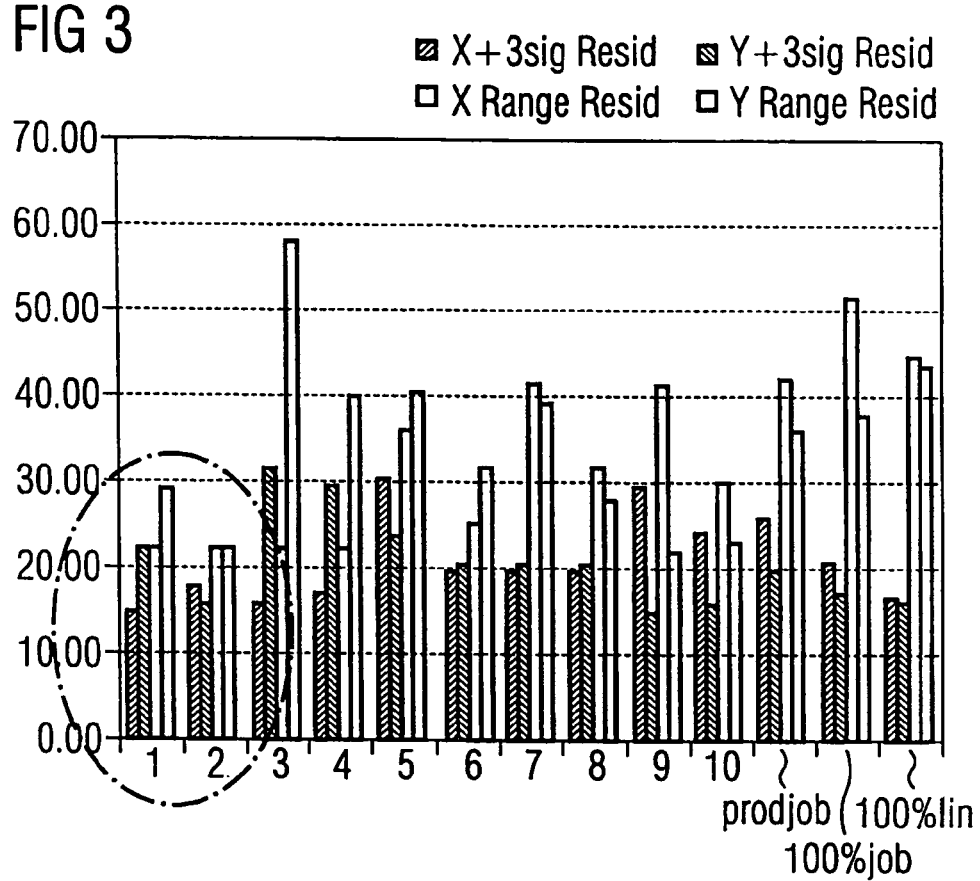
FIG. 3 illustrates measured residuals in x- and y-direction as well as corresponding ranges for ten subsets of overlay targets as well as the results of a 100% measurement.

Each of the results, i.e., the residuals and the ranges, are compared with the result of 100% LIN dataset. As indicated in FIG. 3 by the ellipse, combined overlay target subsets No. 1 und No. 2 provide best correlation with the results of 100% LIN dataset. As a result of this analysis, overlay target subset No. 1 is selected and the coordinates stored on a control unit of a measurement tool such as a computer.

Figure 4:
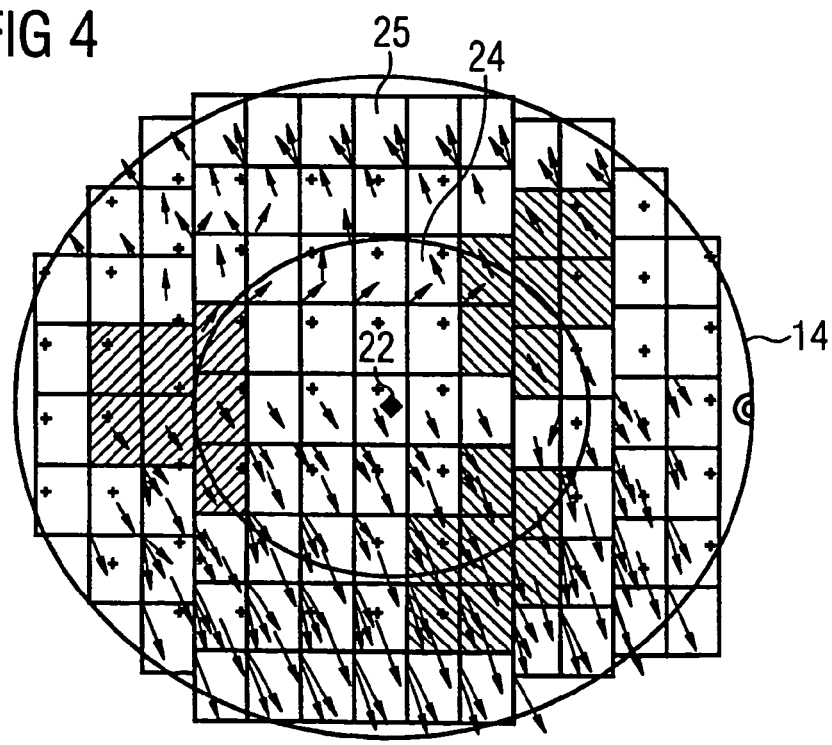
FIG. 4 is similar to FIG. 1 or 2, with finally selected subsets indicated, which are derived from the comparison step.

Running the method steps of the invention discussed so far utilizing an even larger number of subsets, an optimized combination of subsets of exposure fields 12 can be obtained. Therein, it is further possible to define not just only three exposure fields per subset (6 per combined subset), but also four or five, etc. exposure fields per concentric area 24, 25. Results of an optimized combined subset of exposure fields are shown in FIG. 4. In this example, a continuous extension of the three exposure fields 12 of subset 31 shown in FIG. 2 is formed which represents all the three types of overlay shifts discussed above. These were: a lower portion having large overlay shifts, a stripe with very small overlay shifts and an upper portion of wafer 14 having overlay shifts directed in opposite direction to those shifts of the lower portion.

The positions or coordinates of the exposure fields belonging to the finally selected subset are stored and used for measuring the overlay shifts of a second and any further wafer of the same lot or other lots that refer to the same product. Instead of measuring overlay targets residing in 100 exposure fields 12 contained in the matrix-like arrangement 10 shown in FIGS. 1, 2, 4, rather those overlay targets residing in the 21 exposure fields contained in the subset shown in FIG. 4 are measured when performing an overlay measurement. As the subset displayed in FIG. 2 best represents the overall overlay measurement results of the first wafer, the corresponding results obtained from overlay targets residing within the same fields on further wafers are considered to accurately represent the individual measurement results of that specific wafer.

Figure 6:
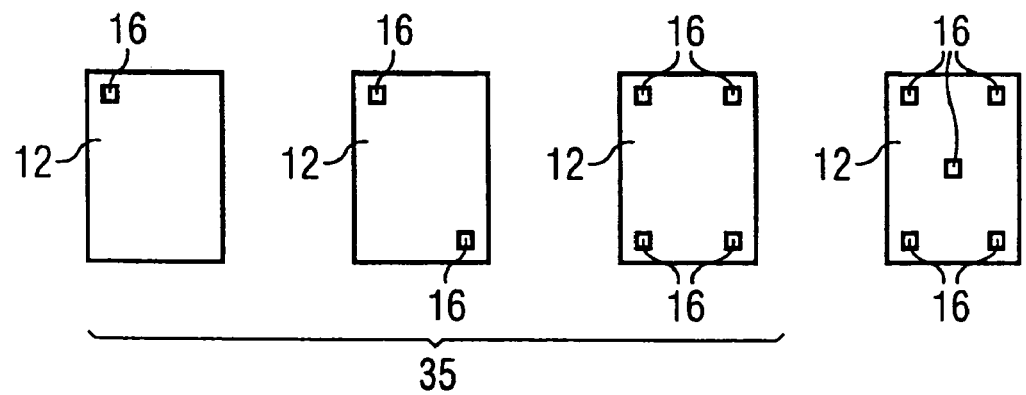
FIG. 6 is a schematic illustration of distribution of overlay targets within an exposure field.

According to the embodiment discussed with regard to FIGS. 1–4, the number of overlay targets selected for future measurements of the overlay accuracy of wafers of the same lot or product has been reduced from, e.g., 500 to 100, when 5 overlay targets 16 per exposure field 12 are considered as illustrated in FIG. 6.

Figure 5:
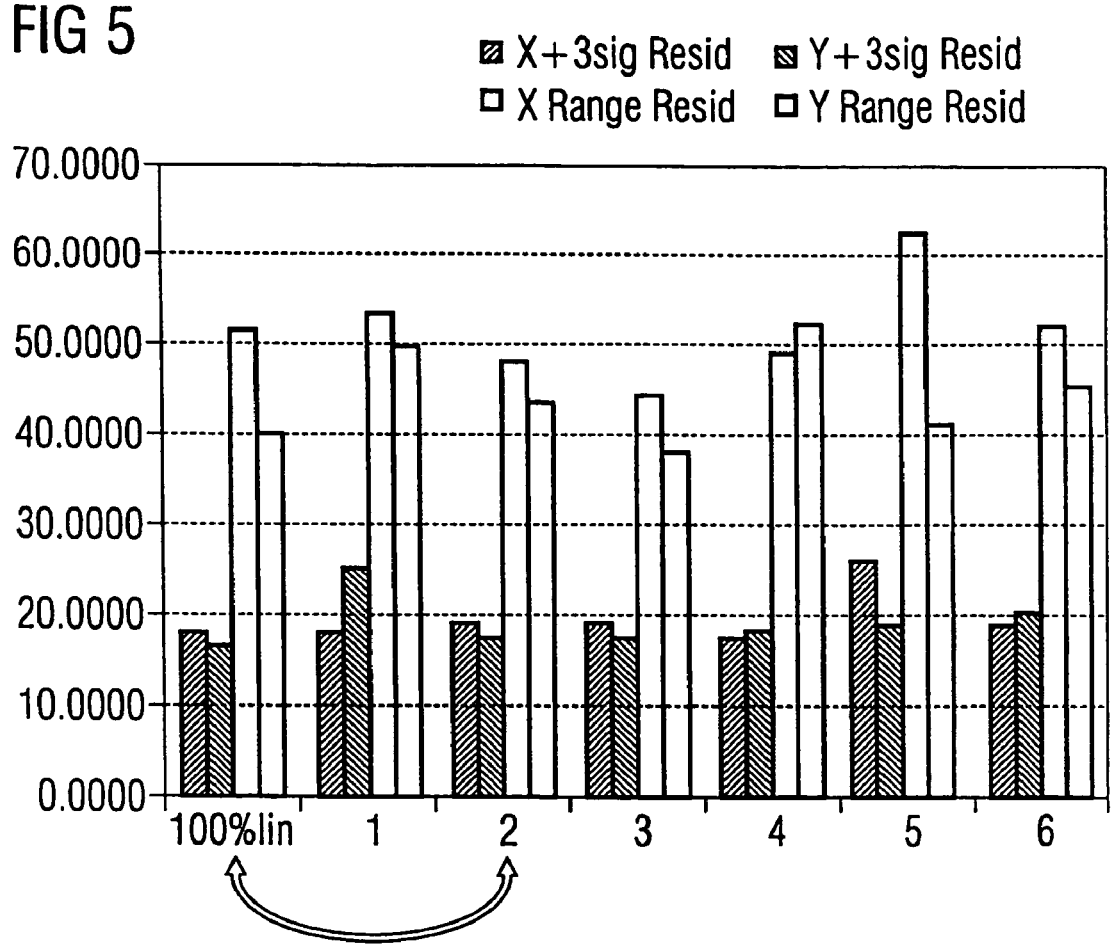
FIG. 5 illustrates measurement results of residuals and ranges in x- and y-direction of further reduced subsets of overlay targets.

However, it is further possible to reduce the number of overlay targets by selecting a reduced number of overlay targets in each exposure field. For example, a single target as shown on the left side of FIG. 6, symmetric targets, or targets in any corner but not in the center of the exposure field 12 can be selected. Inserting the reduced possible combinations not shown in FIG. 6, and then obtaining the measured shifts from the first wafer for each overlay target, the analysis can be re-run. The results are shown in FIG. 5. The y-axis of both figures represent the magnitude of the metrics in microns. The metrics can be any of the modeled correctable errors, the non-correctable or residual errors, or the total distribution of errors.

There, the results for the calculated residuals as well as ranges in x- and y-direction for 6 types of reduces subsets are compared against the 100% full analysis results (100% LIN). In this embodiment, reduced overlay target subset No. 2 provides best agreement with the 100% analysis. Subset No. 2, e.g., corresponds to the second exposure field 12 displayed in FIG. 6 as counted from the left side.

Accordingly, having provided the 100% measurement analysis of overlay shifts shown in FIG. 1, the method steps led to a selection of a subset of exposure fields 12 as displayed in FIG. 4, wherein for each exposure field 12 over the target 16 in the upper left and lower right corner are utilized to perform an overlay measurement of a further wafer that is considered to represent a corresponding 100% analysis best.

Figure 7B:
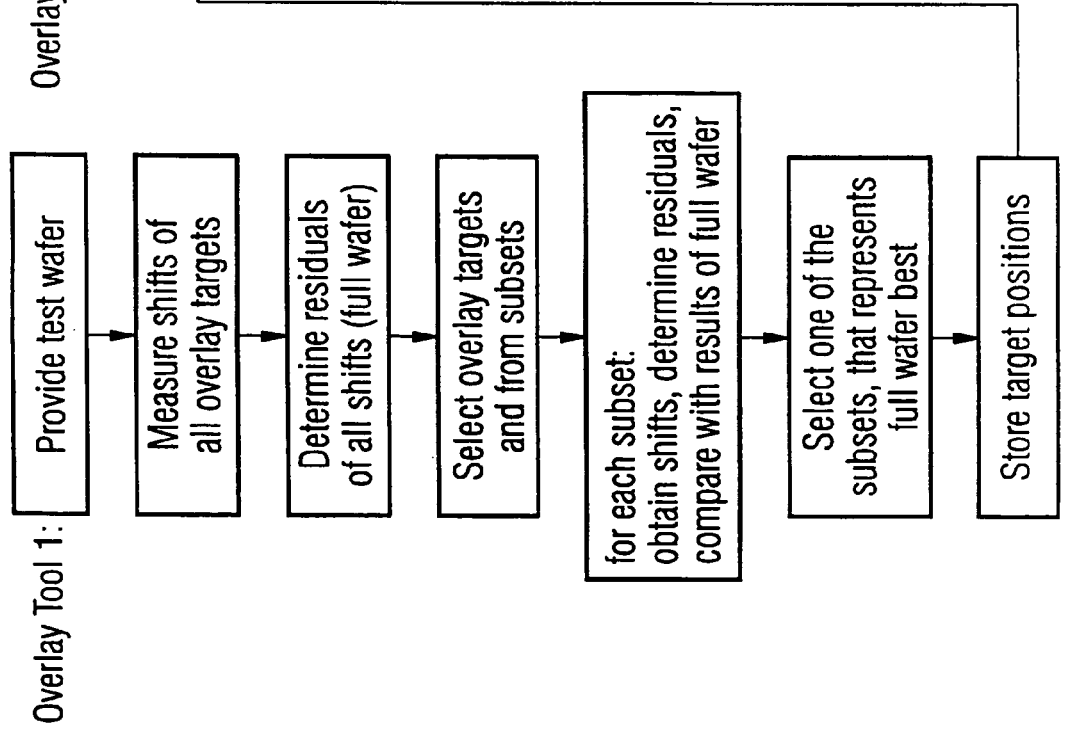
FIG. 7 is a flow chart according to one exemplary embodiment.
Figure 7A:
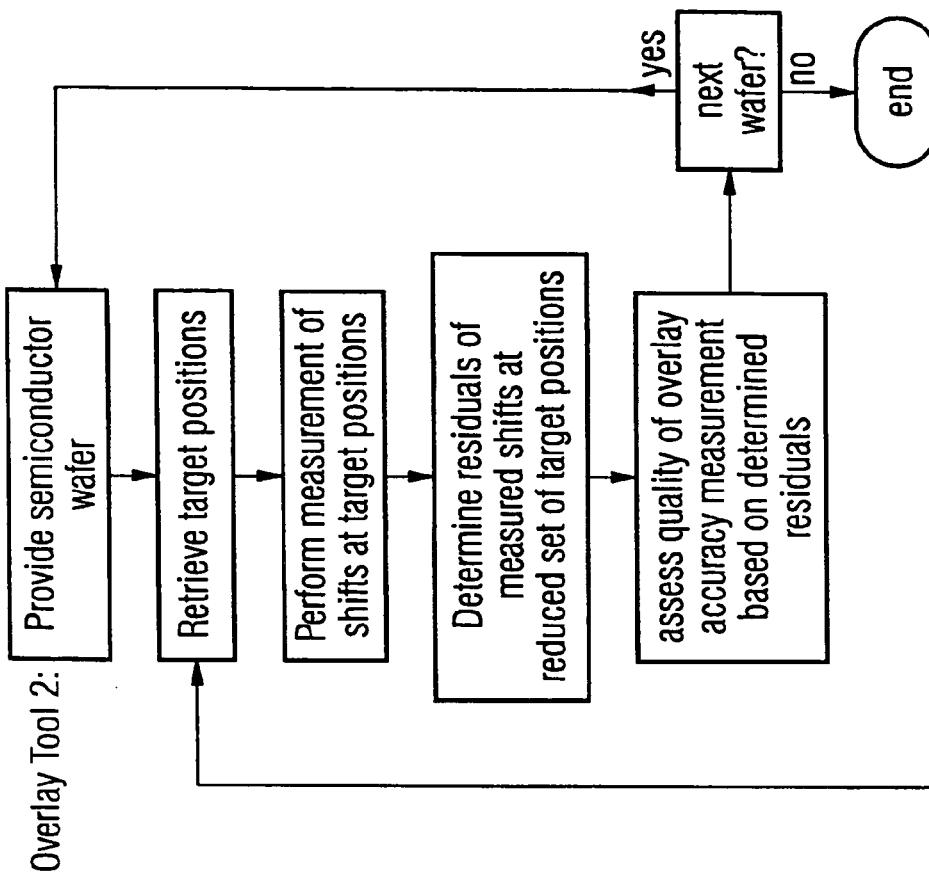

The principles of the method discussed above are displayed in a flow chart of FIG. 7, which shows an exemplary embodiment of the present invention. In that embodiment, different overlay measurement tools no. 1 and 2 are employed and the selected target positions are stored in a control file, that is made available to any other metrology tool in the fabrication facility. On the one hand side, wafers of the same product can thus easily be assessed from different metrology sites within a fab, on the other hand side a trend analysis can be performed by a central factory control system. Occasionally, it might be necessary to amend the subsets of exposure fields or overlay targets in order to find a sufficient representation of the full field wafer results.

Having described embodiments for a method of determining the overlay accuracy, it is noted that modifications and variations can be made by persons skilled in the art in light of the above teachings. It is therefore to be understood that changes may be made in the particular embodiments of the invention disclosed which are within the scope and spirit of the invention as defined by the appended claims.

What is claimed is:

1. A method of determining the overlay accuracy of multiple patterns formed within an arrangement of exposure fields on a semiconductor wafer, comprising:

providing a test wafer to an overlay measurement tool, the test wafer comprising the exposure fields with the patterns and a plurality of overlay targets formed with the patterns across the test wafer;

measuring first shifts of each of the overlay targets;

determining a first set of correctable and/or non-correctable overlay errors from the measured first shifts of the plurality of overlay targets;

selecting a number of overlay targets from said plurality of patterns and forming at least two different subsets thereof, wherein each subset comprises overlay targets residing in at least three of the exposure fields;

for each of the subsets performing the steps a) to c):

a) obtaining the measured first shifts, which correspond to said selected overlay targets;

b) calculate a second set of correctable and/or non-correctable errors from the measured first shifts of the selected overlay targets;

c) comparing the second set of correctable and/or non-correctable errors with the first set of correctable and/or non-correctable errors;

selecting one of the subsets in dependence of the comparison results;

providing the semiconductor wafer and measuring second shifts of those overlay targets, whose positions on the semiconductor wafer coincide with positions of the overlay targets of the selected subset on said test wafer; and assessing the quality of said semiconductor wafer based on said measured second shifts.

2. A method according to claim 1, wherein forming the subsets comprises choosing three or more overlay targets having positions on the test wafer, which are arranged substantially concentric around the center of the test wafer.

3. A method according to claim 1, further comprising:

defining a concentric area, preferably a ring or an inner circle on the test wafer; and selecting the at least two subsets of overlay targets having positions on the test wafer, which are arranged within the concentric area.

4. A method according to claim 3, wherein an outer ring and an inner circle are defined as concentric areas on the test wafer; and one subset is formed each from overlay targets positioned within the inner circle or from overlay targets formed within said outer ring; and the steps of obtaining shifts, determining the second sets of error values, comparing the first and second sets of error values and the step of selecting a subset in dependence of the comparison results are performed for each of the subsets corresponding to the overlay targets formed within the outer ring and the inner circle, separately.

5. The method according to claim 4, further comprising:

the step of combining the selected subsets, which have been selected separately from within the outer ring or from within the inner circle, into one selected subset of overlay targets.

6. The method according claim 1, wherein the first and/or second set of correctable or non-correctable error values are each one or a combination of:

a mean value, any of the modeled errors, residuals, 3 sigma variation or a total range of the measured shifts.

7. A method of determining the overlay accuracy of multiple patterns, which are formed within exposure fields being arranged in a matrix on a semiconductor wafer, comprising:

providing a test wafer to an overlay measurement tool, the test wafer comprising the patterns and plurality overlay targets formed with the patterns in each of the exposure fields across the test wafer;

measuring first shifts of each of the overlay targets;

determining a first set of correctable and/or non-correctable errors from the measured first shifts of the plurality of overlay targets;

selecting each three or more exposure fields comprising overlay targets having first positions from the matrix arrangement and forming at least two subsets thereof;

for each of the subsets performing the steps a) to c):

a) obtaining the measured first shifts of the overlay targets, which are contained within the selected exposure fields of the subset;

b) determining a second set of correctable and/or non-correctable errors from the measured first shifts;

c) comparing the second set of correctable and/or non-correctable errors with the first set of correctable and/or non-correctable errors;

selecting one of the subsets of exposure fields in dependence of the comparison results;

providing the semiconductor wafer and measuring second shifts of those overlay targets, whose positions on the semiconductor wafer coincide with positions of the overlay targets of the selected subset of exposure fields on the test wafer; and assessing the quality of the semiconductor wafer based on the measured second shifts.

8. The method according to claim 7, further comprising: following selecting a subset of exposure fields in dependence of the comparison results:

further selecting each a reduced number of overlay targets from all overlay targets, which are contained within an exposure field of the subset and forming at least two different subsets thereof;

repeating steps a) to c) for each of the subsets having a reduced number of overlay targets;

selecting one of the subsets having a reduced number of overlay targets in dependence of the comparison results obtained in repeated step c); and providing the semiconductor wafer and measuring the second shifts based on the selected subset having a reduced number of overlay targets.

9. The method according to claim 8, wherein the first and/or the second set of correctable or non-correctable error values are each one or a combination of:
a mean value,
modeled errors,
residuals,
3 sigma variation or
a total range of the measured shifts.

10. The method according to claim 7, wherein forming the subsets comprises choosing three or more exposure fields having positions on the test wafer, which are arranged substantially concentric around the center of the test wafer.

11. The method according to claim 10, wherein the first and/or the second set of correctable or non-correctable error values are each one or a combination of:
a mean value,
modeled errors,
residuals,
3 sigma variation or
a total range of the measured shifts.

12. The method according to claim 7, further comprising defining a concentric area, preferably a ring or an inner circle on the test wafer; and selecting the at least two subsets of exposure fields having positions on the test wafer, which are arranged within the concentric area.

13. The method according to claim 12, wherein
an outer ring and an inner circle are defined as concentric areas on the test wafer; and one subset is formed each from exposure fields positioned within the inner circle or from exposure fields formed within said outer ring; and the steps of obtaining shifts, determining the second sets of error values, comparing the first and second sets of error values and selecting a subset in dependence of the comparison results are performed for each of the subsets corresponding to the exposure fields formed within the outer ring and the inner circle, separately.

14. The method according to claim 12, wherein the first and/or the second set of correctable or non-correctable error values are each one or a combination of:
a mean value,
modeled errors,
residuals,
3 sigma variation or
a total range of the measured shifts.

15. The method according to claim 13, further comprising:
combining the selected subsets, which have been selected separately from within the outer ring or from within the inner circle, into one selected subset of exposure fields.

16. The method according to claim 13, wherein the first and/or the second set of correctable or non-correctable error values are each one or a combination of:
a mean value,
modeled errors,
residuals,
3 sigma variation or
a total range of the measured shifts.

17. The method according to claim 15, wherein the first and/or the second set of correctable or non-correctable error values are each one or a combination of:
a mean value,
modeled errors,
residuals,
3 sigma variation or
a total range of the measured shifts.

18. The method according to claim 7, wherein the first and/or the second set of correctable or non-correctable error values are each one or a combination of:
a mean value,
modeled errors,
residuals,
3 sigma variation or
a total range of the measured shifts.

* * * * *

UNITED STATES PATENT AND TRADEMARK OFFICE
CERTIFICATE OF CORRECTION

PATENT NO.     : 6,948,149 B2
DATED          : September 20, 2005
INVENTOR(S)    : Goodwin It is certified that error appears in the above-identified patent and that said Letters Patent is hereby corrected as shown below:

<u>Column 9, line 28 through Column 10, line 57,</u>
Claims 9-18 should read:

9. The method according to claim 7, wherein
forming the subsets comprises choosing three or more exposure fields having positions on the test wafer, which are arranged substantially concentric around the center of the test wafer.

10. The method according to claim 7, further comprising
defining a concentric area, preferably a ring or an inner circle on the test wafer; and selecting the at least two subsets of exposure fields having positions on the test wafer, which are arranged within the concentric area.

11. The method according to claim 10, wherein
an outer ring and an inner circle are defined as concentric areas on the test wafer, and one subset is formed each from exposure fields positioned within the inner circle or from exposure fields formed within said outer ring, and
the steps of obtaining shifts, determining the second sets of error values, comparing the first and second sets of error values and selecting a subset in dependence of the comparison results are performed for each of the subsets corresponding to the exposure fields formed within the outer ring and the inner circle, separately.

12. The method according to claim 11, further comprising:
combining the selected subsets, which have been selected separately from within the outer ring or from within the inner circle, into one selected subset of exposure fields.

13. The method according to claim 7, wherein the first and/or the second set of correctable or non-correctable error values are each one or a combination of:
a mean value,
modeled errors,
residuals,
3 sigma variation or
a total range of the measured shifts.

14. The method according to claim 8, wherein the first and/or the second set of correctable or non-correctable error values are each one or a combination of:
a mean value,
modeled errors,
residuals,
3 sigma variation or
a total range of the measured shifts.

UNITED STATES PATENT AND TRADEMARK OFFICE
CERTIFICATE OF CORRECTION

PATENT NO. : 6,948,149 B2
DATED : September 20, 2005
INVENTOR(S) : Goodwin

It is certified that error appears in the above-identified patent and that said Letters Patent is hereby corrected as shown below:

<u>Column 9, line 28 through Column 10, line 57, (cont'd),</u>
15. The method according to claim 9, wherein the first and/or the second set of correctable or non-correctable error values are each one or a combination of:
a mean value,
modeled errors,
residuals,
3 sigma variation or
a total range of the measured shifts.

16. The method according to claim 10, wherein the first and/or the second set of correctable or non-correctable error values are each one or a combination of:
a mean value,
modeled errors,
residuals,
3 sigma variation or
a total range of the measured shifts.

17. The method according to claim 11, wherein the first and/or the second set of correctable or non-correctable error values are each one or a combination of:
a mean value,
modeled errors,
residuals,
3 sigma variation or
a total range of the measured shifts.

UNITED STATES PATENT AND TRADEMARK OFFICE
CERTIFICATE OF CORRECTION

PATENT NO. : 6,948,149 B2
DATED : September 20, 2005
INVENTOR(S) : Goodwin

It is certified that error appears in the above-identified patent and that said Letters Patent is hereby corrected as shown below:

<u>Column 9, line 28 to Column 10, line 57, (cont'd),</u>
18. The method according to claim 12, wherein the first and/or the second set of correctable or non-correctable error values are each one or a combination of:
a mean value,
modeled errors,
residuals,
3 sigma variation or
a total range of the measured shifts.

Signed and Sealed this

Twentieth Day of December, 2005

JON W. DUDAS
*Director of the United States Patent and Trademark Office*